United States Patent
Su

(10) Patent No.: US 10,152,445 B2
(45) Date of Patent: Dec. 11, 2018

(54) SIGNAL COUNT REDUCTION BETWEEN SEMICONDUCTOR DIES ASSEMBLED IN WAFER-LEVEL PACKAGE

(71) Applicant: MEDIATEK INC., Hsinchu (TW)

(72) Inventor: Yao-Chun Su, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 55 days.

(21) Appl. No.: 15/009,819

(22) Filed: Jan. 28, 2016

(65) Prior Publication Data

US 2016/0239452 A1 Aug. 18, 2016

Related U.S. Application Data

(60) Provisional application No. 62/117,086, filed on Feb. 17, 2015, provisional application No. 62/198,650, filed on Jul. 29, 2015.

(51) Int. Cl.
| | |
|---|---|
| *G06F 13/00* | (2006.01) |
| *G06F 13/38* | (2006.01) |
| *G06F 13/40* | (2006.01) |
| *G06F 13/42* | (2006.01) |
| *G06F 13/362* | (2006.01) |
| *G06F 13/364* | (2006.01) |
| *H01L 23/00* | (2006.01) |

(52) U.S. Cl.
CPC ........ *G06F 13/4068* (2013.01); *G06F 13/364* (2013.01); *G06F 13/3625* (2013.01); *G06F 13/4282* (2013.01); *H01L 24/20* (2013.01); *H01L 2224/04105* (2013.01); *H01L 2224/24137* (2013.01)

(58) Field of Classification Search
None
See application file for complete search history.

(56) References Cited

U.S. PATENT DOCUMENTS

| | | | |
|---|---|---|---|
| 4,912,633 A | 3/1990 | Schweizer | |
| 5,613,077 A | 3/1997 | Leung | |
| 6,317,804 B1 * | 11/2001 | Levy | G06F 13/4022 710/305 |
| 6,845,184 B1 * | 1/2005 | Yoshimura | G02B 6/12002 385/14 |
| 7,911,952 B1 | 3/2011 | Nygreen et al. | |
| 9,124,383 B1 * | 9/2015 | Frankel | H04J 14/06 |
| 9,287,208 B1 | 3/2016 | Khare | |

(Continued)

FOREIGN PATENT DOCUMENTS

| | | | |
|---|---|---|---|
| EP | 0 866 404 A2 | 9/1998 | |
| EP | 0 866 404 A3 | 9/2002 | |

OTHER PUBLICATIONS

Chinese Office Action dated Mar. 16, 2018 in corr. Chinese Patent Application No. 201610087157.1 (w/ English translation of Categories of Cited Documents) 13 pp.

*Primary Examiner* — Michael Sun
(74) *Attorney, Agent, or Firm* — Oblon, McClelland, Maier & Neustadt, L.L.P.

(57) ABSTRACT

A semiconductor die assembled in a wafer-level package includes a processing circuit, a multiplexer, and a transmit interface. The processing circuit generates a plurality of signal outputs. The multiplexer multiplexes the signal outputs into a multiplexed signal. The transmit interface transmits the multiplexed signal to another semiconductor die assembled in the wafer-level package.

25 Claims, 10 Drawing Sheets

(56) References Cited

U.S. PATENT DOCUMENTS

| | | | |
|---|---|---|---|
| 9,432,298 B1* | 8/2016 | Smith | H04L 49/9057 |
| 2002/0181455 A1* | 12/2002 | Norman | H04L 49/15 |
| | | | 370/386 |
| 2003/0043790 A1 | 3/2003 | Gutierrez | |
| 2005/0083217 A1 | 4/2005 | Kim | |
| 2005/0094927 A1* | 5/2005 | Kish, Jr. | B82Y 20/00 |
| | | | 385/14 |
| 2009/0077289 A1 | 3/2009 | Pagan | |
| 2009/0103345 A1* | 4/2009 | McLaren | G11C 5/02 |
| | | | 365/64 |
| 2010/0174936 A1 | 7/2010 | Hill | |
| 2011/0202799 A1* | 8/2011 | Pagani | G01R 31/3025 |
| | | | 714/27 |
| 2011/0208906 A1 | 8/2011 | Gillingham | |
| 2012/0068360 A1* | 3/2012 | Best | H01L 23/481 |
| | | | 257/774 |
| 2013/0039615 A1* | 2/2013 | Nguyen | G02B 6/12004 |
| | | | 385/14 |
| 2013/0286614 A1* | 10/2013 | Tan | H01L 24/96 |
| | | | 361/764 |
| 2014/0104935 A1* | 4/2014 | Ware | G06F 13/4068 |
| | | | 365/154 |
| 2014/0192583 A1 | 7/2014 | Rajan et al. | |
| 2015/0185282 A1* | 7/2015 | Wang | G01R 31/318513 |
| | | | 324/762.02 |

* cited by examiner (A)

(B)

SIGNAL COUNT REDUCTION BETWEEN SEMICONDUCTOR DIES ASSEMBLED IN WAFER-LEVEL PACKAGE

CROSS REFERENCE TO RELATED APPLICATIONS

This application claims the benefit of U.S. provisional application No. 62/117,086 (filed on Feb. 17, 2015) and U.S. provisional application No. 62/198,650 (filed on Jul. 29, 2015). The entire contents of the related applications are incorporated herein by reference.

BACKGROUND

The present invention relates to a chip design, and more particularly, to a signal count reduction technique applied to a wafer-level package having multiple semiconductor dies assembled therein.

When a chip function of a target chip is achieved using a large-sized die, the fabrication of large-sized dies on a wafer will suffer from low yield and high cost. Given the same die area, the yield of one large die is lower than the yield of multiple small dies. More specifically, assuming that distribution of defects on a wafer is the same, a die yield of one large-sized die fabricated on the wafer is lower than a die yield of multiple small-sized dies which have the same area fabricated on the same wafer. However, splitting one large die into multiple smaller dies may bring some overhead. For example, a large number of signals will be introduced to achieve communications between different small-sized dies. As a result, an extra area will be needed by signal trace routing when more signals are needed to be transmitted between small-sized dies. Consequently, the production cost of using small-sized dies to implement the full function of a large-sized die is increased due to the extra area needed by signal traces routed between small-sized dies. Thus, there is a need for an innovative design which can achieve signal count reduction between dies.

SUMMARY

One of the objectives of the claimed invention is to provide a signal count reduction technique applied to a wafer-level package having multiple semiconductor dies assembled therein.

According to a first aspect of the present invention, an exemplary semiconductor die assembled in a wafer-level package is disclosed. The exemplary semiconductor die includes a processing circuit, a multiplexer, and a transmit interface. The processing circuit is arranged to generate a plurality of signal outputs. The multiplexer is arranged to multiplex the signal outputs into a multiplexed signal. The transmit interface is arranged to transmit the multiplexed signal to another semiconductor die assembled in the wafer-level package.

According to a second aspect of the present invention, an exemplary semiconductor die assembled in a wafer-level package is disclosed. The exemplary semiconductor die includes a processing circuit, an arbiter, and a transmit interface. The processing circuit has a plurality of processing modules arranged to generate a plurality of signal outputs, respectively. The arbiter is arranged to perform arbitration upon transmission requests issued from the processing modules and generate an arbitrated signal according to one of the signal outputs. The transmit interface is arranged to transmit the arbitrated signal to another semiconductor die assembled in the wafer-level package.

According to a third aspect of the present invention, an exemplary semiconductor die assembled in a wafer-level package is disclosed. The exemplary semiconductor die includes a processing circuit, an encoder, and a transmit interface. The processing circuit is arranged to generate a first signal output in a first signal waveform. The encoder is arranged to encode the first signal output to generate a second signal output in a second signal waveform, wherein the second signal waveform is different from the first signal waveform. The transmit interface is arranged to transmit the second signal output to another semiconductor die assembled in the wafer-level package.

According to a fourth aspect of the present invention, an exemplary semiconductor die assembled in a wafer-level package is disclosed. The exemplary semiconductor die includes a receive interface, a demultiplexer, and a processing circuit. The receive interface is arranged to receive a multiplexed signal generated from another semiconductor die assembled in the wafer-level package. The demultiplexer is arranged to demultiplex the multiplexed signal into a plurality of signal inputs. The processing circuit is arranged to receive the signal inputs from the demultiplexer.

According to a fifth aspect of the present invention, an exemplary semiconductor die assembled in a wafer-level package is disclosed. The exemplary semiconductor die includes a receive interface, a processing circuit, and a dispatcher. The receive interface is arranged to receive an arbitrated signal generated from another semiconductor die assembled in the wafer-level package. The processing circuit has at least one processing module. The dispatcher is arranged to dispatch the arbitrated signal to the at least one processing module.

According to a sixth aspect of the present invention, an exemplary semiconductor die assembled in a wafer-level package is disclosed. The exemplary semiconductor die includes a receive interface, a decoder, and a processing circuit. The receive interface is arranged to receive a second signal output in a second signal waveform from another semiconductor die assembled in the wafer-level package. The decoder is arranged to decode the second signal input to generate a first signal input in a first signal waveform, wherein the second signal waveform is different from the first signal waveform. The processing circuit is arranged to receive the first signal input.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Wafer-level packaging is the technology of packaging semiconductor dies, which is different from a typical packaging method of slicing a wafer into individual semiconductor dies and then packaging the individual semiconductor dies. The wafer-level package mentioned above is therefore fabricated based on wafer-level process. That is, multiple semiconductor dies (e.g., homogeneous dies or heterogeneous dies) assembled in the same wafer-level package and connection paths/transmission buses/communication channels and so on routed between the semiconductor dies are fabricated with wafer-level process. Hence, connection paths, communication buses, or communication channels could be implemented by metal layer (such as RDL metal layer, Re-Distribution Layer, a metal layer on a die that makes the I/O pads of an integrated circuit available in other locations) rather than bonding wire of typical package.

The wafer-level package may be an integrated fan-out (InFO) package or a chip on wafer on substrate (CoWoS) package. Take InFO packages as examples for the following wafer-level packages, but not for a limitation. The wafer-level package used for the proposed ideas may be an InFO package or a CoWoS package, "InFO package" and "CoWoS package" may be interchangeable.

Figure 1:
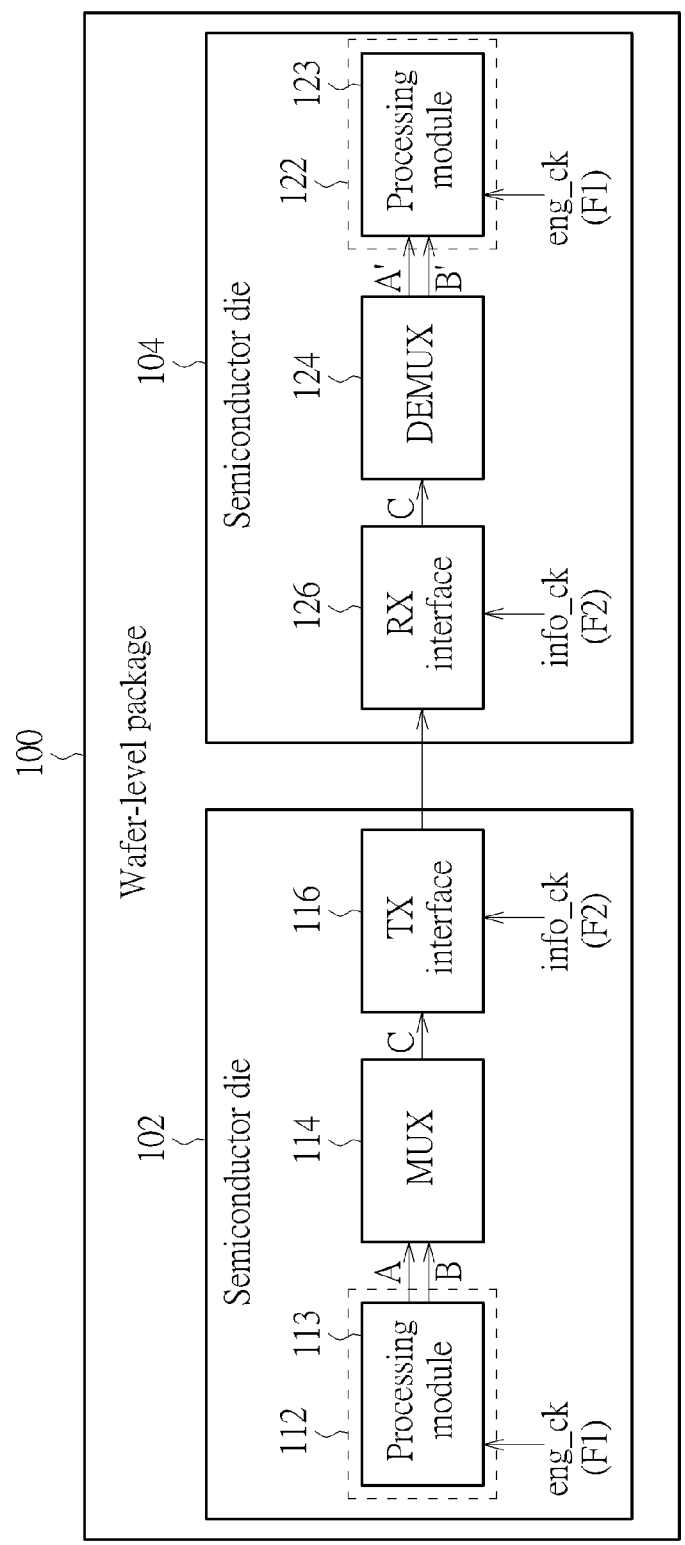
FIG. 1 is a diagram illustrating multiple semiconductor dies assembled in the same package according to a first embodiment of the present invention.

FIG. 1 is a diagram illustrating multiple semiconductor dies assembled in the same package according to a first embodiment of the present invention. In this embodiment, a wafer-level package 100 has two semiconductor dies 102 and 104 assembled therein. The semiconductor dies 102 and 104 are homogeneous dies (i.e., identical dies) or heterogeneous dies (i.e., distinct dies), and/or the semiconductor dies 102 and 104 are assembled in the wafer-level package 100 to perform a network switch function. However, this is for illustrative purposes only, and is not meant to be a limitation of the present invention. Any wafer-level package using the proposed signal count reduction technique falls within the scope of the present invention.

The semiconductor die 102 has a processing circuit 112, a multiplexer (MUX) 114, and a transmit (TX) interface 116. In this embodiment, the processing circuit 112 has a single processing module (e.g., a master engine) 113 arranged to generate a plurality of signal outputs (e.g., A and B) at an engine clock eng_ck. In this embodiment, a time domain multiplexing technique is employed for signal count reduction between semiconductor dies 102 and 104. Hence, the multiplexer 114 is arranged to multiplex the signal outputs (e.g., A and B) into a multiplexed signal (e.g., C). The transmit interface 116 is arranged to transmit the multiplexed signal (e.g., C) to the semiconductor die 104 at an interface clock info_ck, where the clock frequency F2 of the interface clock info_ck is higher than the clock frequency F1 of the engine clock eng_ck.

The engine clock eng_ck can run at any clock frequency F1, and the data compression rate depends on the ratio between clock frequencies F1 and F2 of in-phase (e.g., multiple frequency)/synchronous (e.g., same frequency) engine clock eng_ck and interface clock info_ck. For example, if the clock frequency ratio of engine clock eng_ck and interface clock info_ck is 2:3 (i.e., F1:F2=2:3), consecutive 2T messages transmitted on the basis of the engine clock eng_ck can be carried on consecutive 3T messages transmitted on the basis of the interface clock info_ck, where the signal count can be reduced to ⅔.

Figure 2:
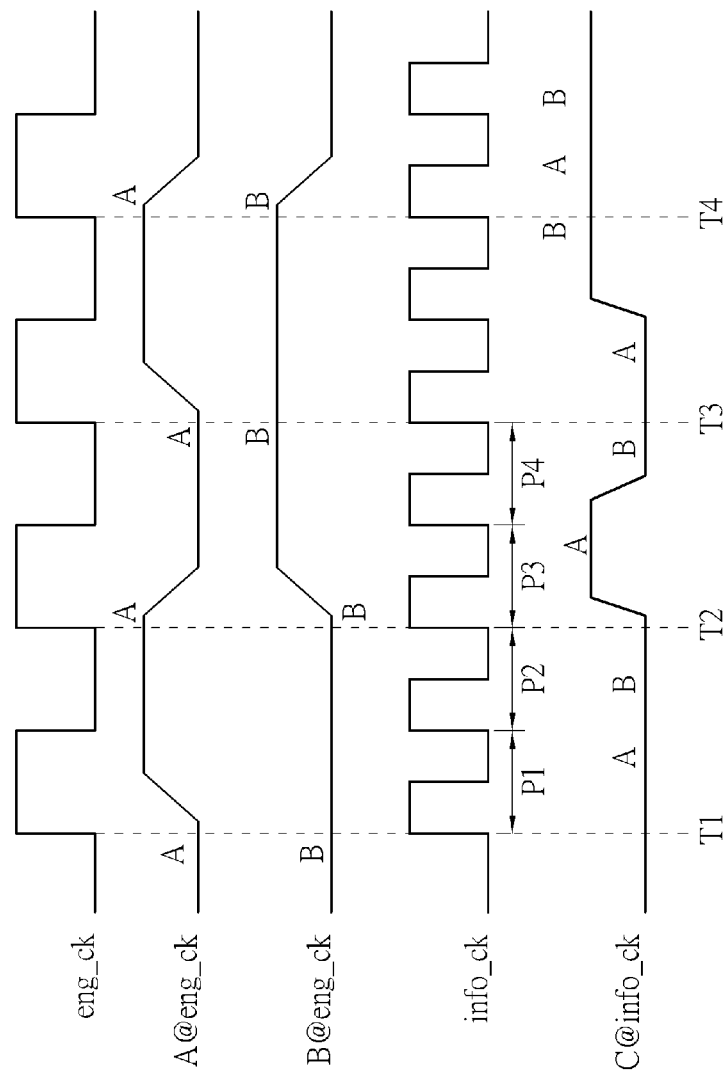
FIG. 2 is a timing diagram illustrating a time domain multiplexing technique employed for signal count reduction between semiconductor dies according to an embodiment of the present invention.

FIG. 2 is a timing diagram illustrating a time domain multiplexing technique employed for signal count reduction between semiconductor dies 102 and 104 according to an embodiment of the present invention. Assume that the clock frequency ratio of engine clock eng_ck and interface clock info_ck is 1:2 (i.e., F1:F2=1:2). Hence, there are two interface clock periods within one engine clock period. At the time point T1, the signal outputs A and B are simultaneously sampled at a rising edge of the engine clock eng_ck, where a sample value of the signal output A is '0', and a sample value of the signal output B is '0'. The sample values of the signal outputs A and B are sequentially transmitted during two consecutive clock periods P1 and P2 of the interface clock info_ck. Similarly, at the time point T2, the signal outputs A and B are simultaneously sampled at a rising edge of the engine clock eng_ck, where a sample value of the signal output A is '1', and a sample value of the signal output B is '0'. The sample values of the signal outputs A and B are sequentially transmitted during two consecutive clock periods P3 and P4 of the interface clock info_ck. Since the following time domain multiplexing technique can be deduced by analogy, further description is omitted here for brevity.

With regard to the semiconductor die 104, it has a processing circuit 122, a demultiplexer (DEMUX) 124, and a receive (RX) interface 126. The receive interface 126 is arranged to receive the multiplexed signal C (which is generated from signal multiplexing performed on the semiconductor die 102) according to the interface clock info_ck. The demultiplexer 124 at the RX side is arranged to perform an inverse operation of the signal multiplexing performed by the multiplexer 114 at the TX side. That is, the demultiplexer 124 is arranged to demultiplex a multiplexed signal (e.g., C) into a plurality of signal inputs (e.g., A' and B').

Ideally, the signal inputs (e.g., A' and B') correspondingly recovered at the RX side should be identical to the signal outputs (e.g., A and B) correspondingly generated at the TX side and keep relative timing relationship. The processing circuit 122 has a single processing module (e.g., a slave engine) 123 arranged to receive and process the signal inputs A' and B' at the engine clock eng_ck. Since a person skilled in the art can readily understand details of signal demultiplexing after reading paragraphs directed to signal multiplexing illustrated in FIG. 2, further description is omitted here for brevity.

Figure 3:
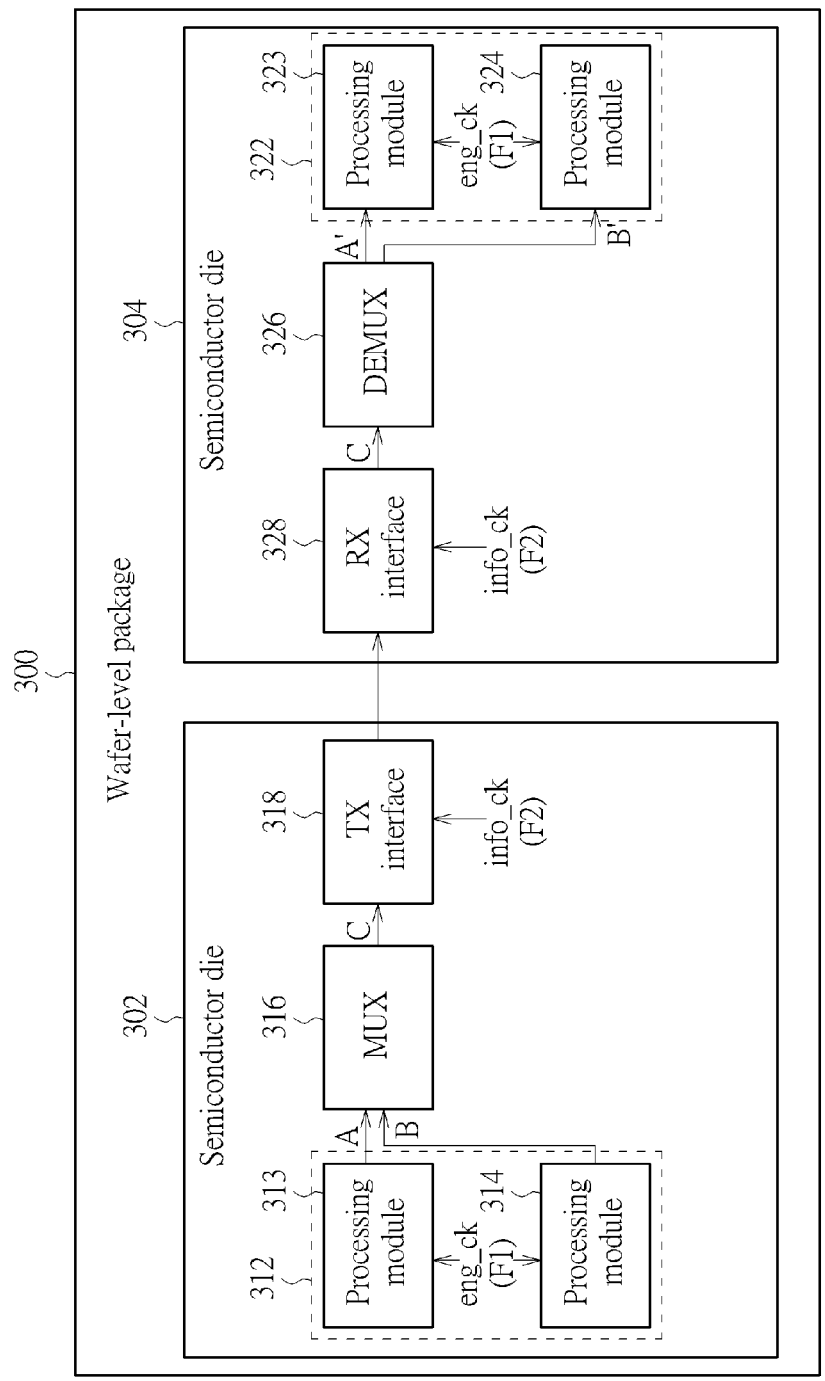
FIG. 3 is a diagram illustrating multiple semiconductor dies assembled in the same package according to a second embodiment of the present invention.

FIG. 3 is a diagram illustrating multiple semiconductor dies assembled in the same package according to a second embodiment of the present invention. In this embodiment, a wafer-level package 300 has two semiconductor dies 302 and 304 assembled therein. For example, the wafer-level package 300 may be an integrated fan-out (InFO) package, and/or the semiconductor dies 302 and 304 are arranged to perform a network switch function. However, this is for illustrative purposes only, and is not meant to be a limitation of the present invention. Any wafer-level package using the proposed signal count reduction technique falls within the scope of the present invention.

In this embodiment, the semiconductor die 302 has a processing circuit 312, a multiplexer (MUX) 316, and a transmit (TX) interface 318. The processing circuit 312 has multiple processing modules (e.g., master engines) 313 and 314 operating at the engine clock eng_ck and arranged to generate a plurality of signal outputs A and B, respectively. In addition, a function guaranteed time domain multiplexing technique is employed for signal count reduction between semiconductor dies 302 and 304. Hence, the processing modules 313 and 314 are arranged to generate the signal outputs A and B, correspondingly (e.g., alternately).

For example, when one of the processing modules (e.g., 313 and 314) is operated in a communication state to generate a corresponding signal output, the rest of the processing modules (e.g., 313 and 314) are operated in an execution state; in addition, the processing modules (e.g., 313 and 314) alternately enter the communication state in a pre-defined order. Concerning the embodiment shown in FIG. 3, when the processing module 313 is operated in the communication state, the processing module 314 is operated in the execution state; and when the processing module 313 is operated in the execution state, the processing module 314 is operated in the communication state. Therefore, while the processing module 313 is operated in the communication state to generate the signal output A to the multiplexer 316, the processing module 314 is operated in the execution state without generating the signal output B to the multiplexer 316; and while the processing module 313 is operated in the execution state without generating the signal output A to the multiplexer 316, the processing module 314 is operated in the communication state to generate the signal output B to the multiplexer 316.

The multiplexer 316 is arranged to multiplex the signal outputs (e.g., A and B) into a multiplexed signal (e.g., C). The transmit interface 318 is arranged to transmit the multiplexed signal (e.g., C) to the semiconductor die 304 at an interface clock info_ck. It should be noted that the clock frequency F2 of the interface clock info_ck may be equal to or different from the clock frequency F1 of the engine clock eng_ck, depending upon actual design considerations.

Figure 4:
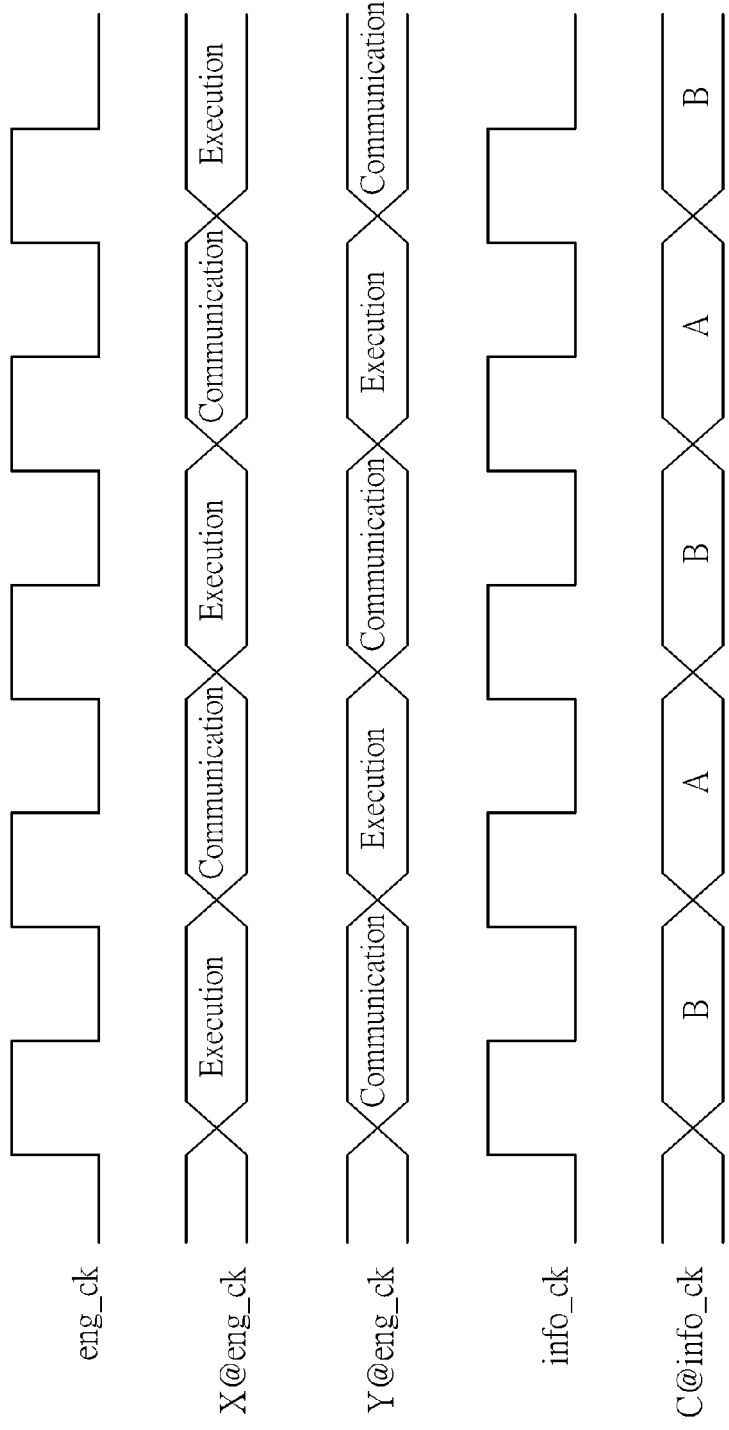
FIG. 4 is a timing diagram illustrating a function guaranteed time domain multiplexing technique employed for signal count reduction between semiconductor dies according to an embodiment of the present invention.

FIG. 4 is a timing diagram illustrating a function guaranteed time domain multiplexing technique employed for signal count reduction between semiconductor dies 302 and 304 of FIG. 3 according to an embodiment of the present invention. Assume that the engine clock eng_ck and the interface clock info_ck have the same clock frequency. A first module X (e.g., processing module 313) enters the execution state and the communication state, alternately. A second module Y (e.g., processing module 314) enters the communication state and the execution state, alternately. Hence, the first module X and the second module Y do not operate in the communication state during the same engine clock period. In this way, the multiplexed signal C carries the signal output B and the signal output A, alternately.

Concerning the semiconductor die 304, it has a processing circuit 322, a demultiplexer (DEMUX) 326, and a receive (RX) interface 328. The receive interface 328 is arranged to receive the multiplexed signal C (which is generated from signal multiplexing performed on the semiconductor die 302) according to the interface clock info_ck. The demultiplexer 326 at the RX side is arranged to perform an inverse operation of the signal multiplexing performed by the multiplexer 316 at the TX side. That is, the demultiplexer 326 is arranged to demultiplex a multiplexed signal (e.g., C) into a plurality of signal inputs (e.g., A' and B').

Ideally, the signal inputs (e.g., A' and B') correspondingly recovered at the RX side should be identical to the signal outputs (e.g., A and B) correspondingly generated at the TX side and keep relative timing relationship. The processing circuit 322 has multiple processing modules (e.g., slave engines) 323 and 324 arranged to receive and process the signal inputs A' and B' at the engine clock eng_ck. Since the TX-side processing modules (e.g., 313 and 314) alternately enter the communication state in a pre-defined order, the demultiplexer 326 correspondingly (e.g., alternately) generates the signal inputs (e.g., A' and B') recovered at the RX side to the counterpart RX-side processing modules (e.g., 323 and 324) in the same pre-defined order. Since a person skilled in the art can readily understand details of signal demultiplexing after reading paragraphs directed to signal multiplexing illustrated in FIG. 4, further description is omitted here for brevity.

Figure 5:
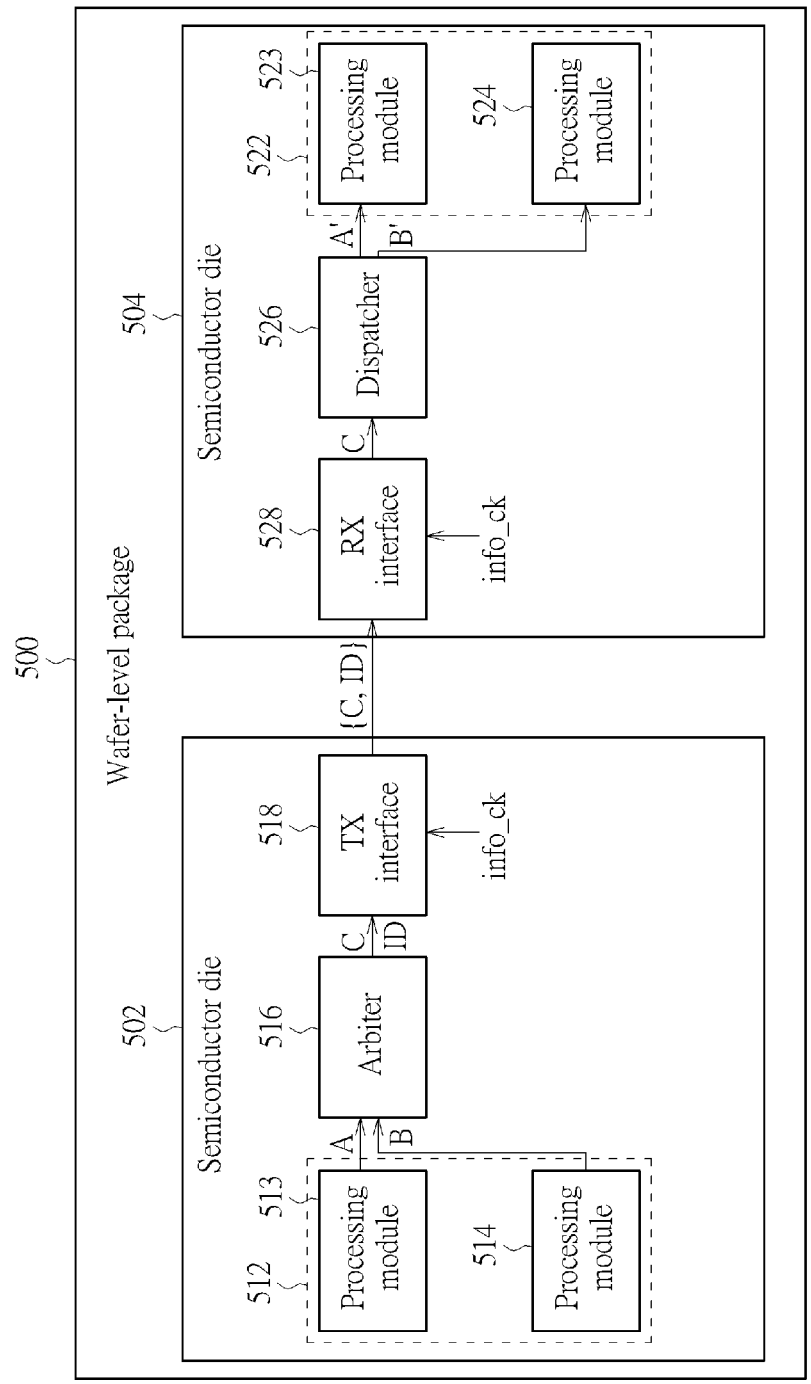
FIG. 5 is a diagram illustrating multiple semiconductor dies assembled in the same package according to a third embodiment of the present invention.

FIG. 5 is a diagram illustrating multiple semiconductor dies assembled in the same package according to a third embodiment of the present invention. In this embodiment, a wafer-level package 500 has two semiconductor dies 502 and 504 assembled therein. For example, the wafer-level package 500 is an integrated fan-out (InFO) package, and/or the semiconductor dies 502 and 504 are arranged to perform a network switch function. However, this is for illustrative purposes only, and is not meant to be a limitation of the present invention. Any wafer-level package using the proposed signal count reduction technique falls within the scope of the present invention.

In this embodiment, the semiconductor die 502 has a processing circuit 512, an arbiter 516, and a transmit (TX) interface 518. The processing circuit 512 has multiple processing modules (e.g., master engines) 513 and 514 arranged to generate a plurality of signal outputs A and B, respectively. In this embodiment, the processing modules 513 and 514 can be active at the same time and thus can issue transmission requests at the same time. Hence, the arbiter 516 is arranged to perform arbitration upon transmission requests (e.g., write requests) issued from the processing modules 513 and 514 and generate an arbitrated signal C according to one of the signal outputs A and B.

For example, when the processing module 513 is granted to access the transmission bus between semiconductor dies 502 and 504, the arbiter 516 generates the signal output A to the TX interface 518, and instructs the processing module 514 to wait for availability of the transmission bus between semiconductor dies 502 and 504. For another example, when the processing module 514 is granted to access the transmission bus between semiconductor dies 502 and 504, the arbiter 516 generates the signal output B to the TX interface 518, and instructs the processing module 513 to wait for availability of the transmission bus between semiconductor dies 502 and 504. To put it simply, the arbiter 516 performs flow control upon the processing modules 513 and 514, such that only one of the processing modules 513 and 514 can be allowed to send its signal output through the arbiter 516 at a time.

Moreover, the arbiter 516 is further arranged to generate identification information ID that indicates which of the processing modules 513 and 514 issues a transmission request granted by the arbiter 516. For example, when the processing module 513 is granted to access the transmission bus between semiconductor dies 502 and 504, the arbiter 516 sets and outputs the identification information ID of the processing module 513. For another example, when the processing module 514 is granted to access the transmission bus between semiconductor dies 502 and 504, the arbiter 516 sets and outputs the identification information ID of the processing module 514. After the arbitrated signal C and the associated identification information ID are generated from the arbiter 516, the transmit interface 518 is arranged to transmit the arbitrated signal C and the associated identification information ID to the semiconductor die 504 at an interface clock info_ck.

With regard to the semiconductor die 504, it has a processing circuit 522, a dispatcher 526, and a receive (RX) interface 528. The receive interface 528 is arranged to receive the arbitrated signal C (which is generated from transmission arbitration performed on the semiconductor die 502) and the associated identification information ID according to the interface clock info_ck. The processing circuit 522 has multiple processing modules 523 and 524 for processing messages generated from the multiple processing modules 513 and 514 respectively.

For example, the processing modules 523 at the RX side is arranged to receive a signal input A' derived from the signal output A generated from the processing module 513 at the TX side, and the processing modules 524 at the RX side is arranged to receive a signal input B' derived from the signal output B generated from the processing module 514 at the TX side. Ideally, the signal input A' recovered at the RX side should be identical to the signal input A generated at the TX side, and the signal input B' recovered at the RX side should be identical to the signal input B generated at the TX side.

The dispatcher 526 at the RX side is arranged to dispatch the arbitrated signal C to one of the processing modules 523 and 524. More specifically, the dispatcher 526 refers to the identification information ID to determine a destination processing module among the processing modules 523 and 524, and dispatches the arbitrated signal C as a signal input to the destination processing module.

In one implementation, the identification information ID may be an additional signal for a transmission bus between the semiconductor dies 502 and 504. However, this is for illustrative purposes only, and is not meant to be a limitation of the present invention. In an alternative design, the identification information ID is already supported by an adopted bus protocol. For example, when an Advanced extensible Interface (AXI) bus protocol is employed, the master source (e.g., master engine side) can be identified by AWID (write address ID)/ARID (read address ID) specified in the AXI bus protocol.

Figure 6:
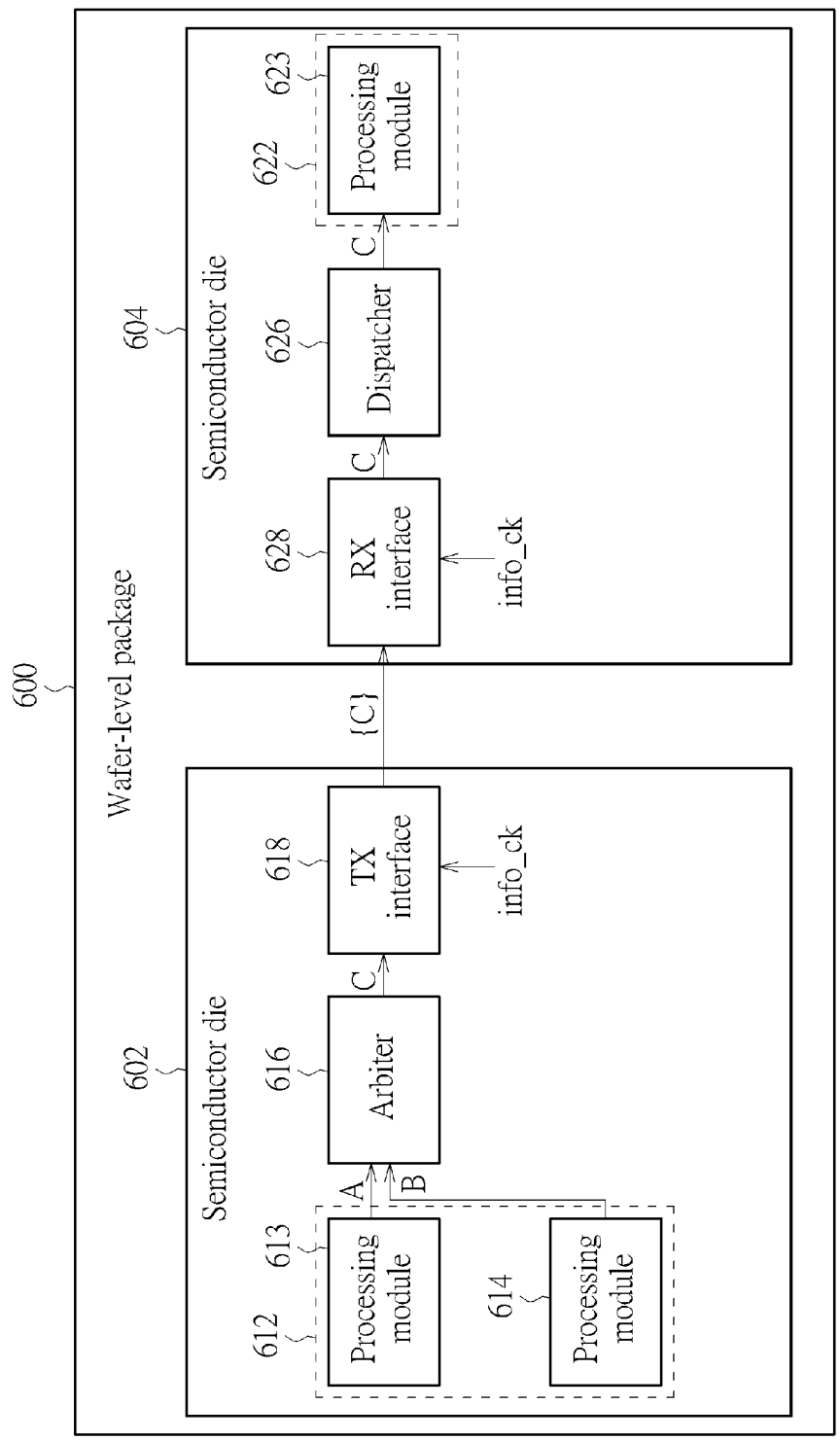
FIG. 6 is a diagram illustrating multiple semiconductor dies assembled in the same package according to a fourth embodiment of the present invention.

FIG. 6 is a diagram illustrating multiple semiconductor dies assembled in the same package according to a fourth embodiment of the present invention. In this embodiment, a wafer-level package 600 has two semiconductor dies 602 and 604 assembled therein. For example, the wafer-level package 600 is an integrated fan-out (InFO) package, and/or the semiconductor dies 602 and 604 are arranged to perform a network switch function. However, this is for illustrative purposes only, and is not meant to be a limitation of the present invention. Any wafer-level package using the proposed signal count reduction technique falls within the scope of the present invention.

The semiconductor die 604 has a processing circuit 622 (which includes a single processing module 623), a dispatcher 626, and a receive (RX) interface 628. In this embodiment, the processing module 623 can be seen as one destination processing module located at the RX side for processing messages generated from more than one processing module at the TX side.

Like the semiconductor die 502 shown in FIG. 5, the semiconductor die 602 has a processing circuit 612 (which has multiple processing modules 613 and 614), an arbiter 616, and a transmit (TX) interface 618. The major difference between the semiconductor dies 502 and 602 is that the arbiter 616 performs arbitration upon transmission requests issued from processing modules 613 and 614 to generate an arbitrated signal C to the transmit interface 618 without associated identification information ID. The reason is that the processing module 622 doesn't need to know the transmission request is generated from which one of the processing module 613 and 614. More specifically, since the signal outputs A and B generated from the processing modules 613 and 614 are all sent to the same destination processing module (i.e., processing module 623), there is no need to generate the identification information to indicate a source of the arbitrated signal C, and the dispatcher 626 dispatches the arbitrated signal C to the processing module 623 only.

Figure 7:
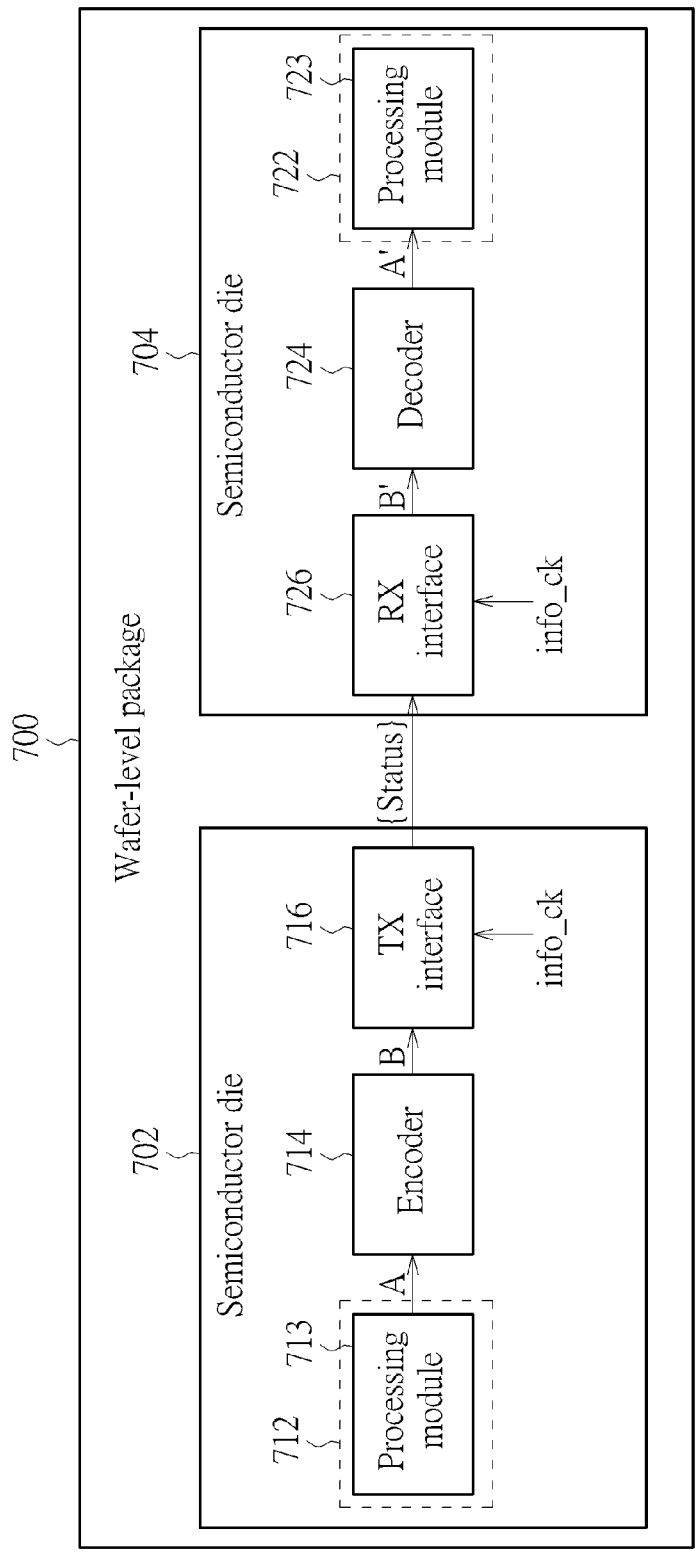
FIG. 7 is a diagram illustrating multiple semiconductor dies assembled in the same package according to a fifth embodiment of the present invention.

FIG. 7 is a diagram illustrating multiple semiconductor dies assembled in the same package according to a fifth embodiment of the present invention. In this embodiment, a wafer-level package 700 has two semiconductor dies 702 and 704 assembled therein. For example, the wafer-level package 700 is an integrated fan-out (InFO) package, and/or the semiconductor dies 702 and 704 are arranged to perform a network switch function. However, this is for illustrative purposes only, and is not meant to be a limitation of the present invention. Any wafer-level package using the proposed signal count reduction technique falls within the scope of the present invention.

The semiconductor die 702 has a processing circuit 712, an encoder 714, and a transmit (TX) interface 716. The processing circuit 712 has one processing module (e.g., master engine) 713 arranged to generate a first signal output A in a first signal waveform. For example, the first signal output A is a less changed signal. In the following, it is assumed that the less changed signal is a status signal such as an interrupt signal. However, this is for illustrative purposes only, and is not meant to be a limitation of the present invention. Therefore, the first signal output A seldom toggles due to its inherent characteristics. In this embodiment, a toggle information delivery technique is employed for signal update frequency reduction between semiconductor dies 702 and 704. The encoder 714 is arranged to perform toggle information encoding for encoding the first signal output A to generate a second signal output B in a second signal waveform, wherein the second signal waveform is different from the first signal waveform. For example, the encoder 714 generates the second signal output B according to toggle information of the first signal output A, such that the toggle information is sent to the semiconductor die 704 via the transmit interface 716.

With regard to the semiconductor die 704, it has a processing circuit 722, a decoder 724, and a receive (RX) interface 726. The receive interface 726 is arranged to receive a second signal input B' in a second signal waveform from the semiconductor die 702. Ideally, the second signal input B' received at the RX side is identical to the second signal output B generated at the TX side. The decoder 724 at the RX side is arranged to perform an inverse operation of toggle information encoding performed by the encoder 714 at the TX side. That is, the decoder 724 is arranged to decode the second signal input B' to generate a first signal input A' in a first signal waveform different from the second signal waveform.

For example, the status signal (e.g., interrupt signal) is restored by toggle information delivered over the transmission bus (e.g., InFO bus) between semiconductor dies 702 and 704. Ideally, the first signal input A' recovered at the RX side is identical to the first signal output A generated at the TX side. After the first signal input A' is recovered by the decoder 724, the processing module 723 receives the first signal input A' and operates in response to the received first signal input A'.

Figure 8:
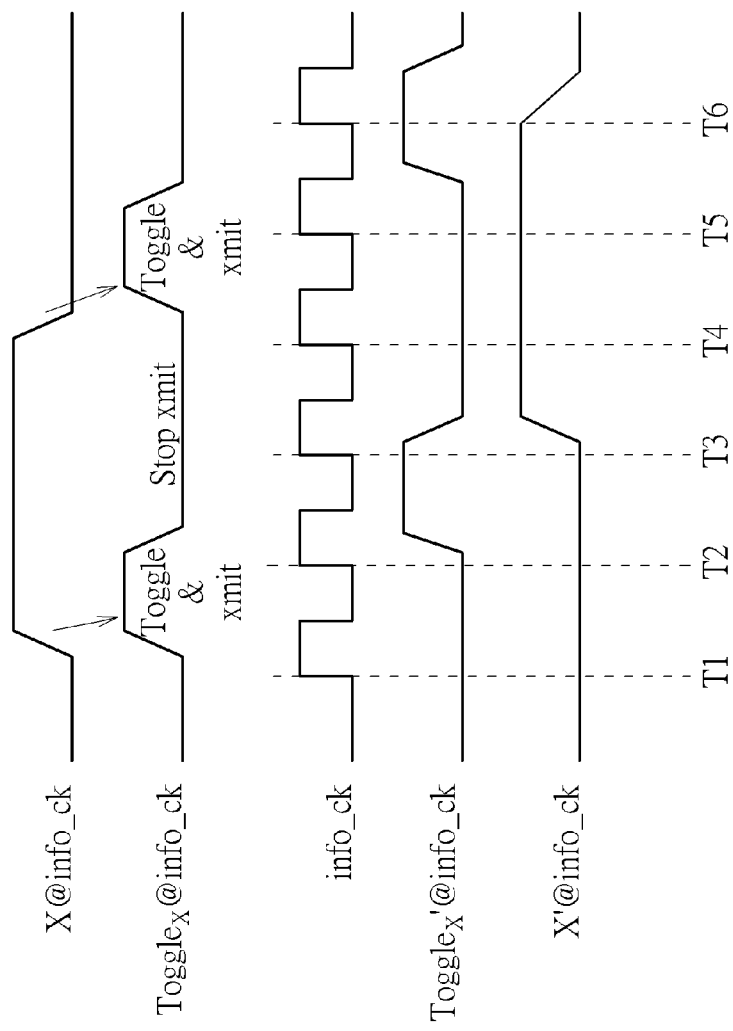
FIG. 8 is a timing diagram illustrating a toggle information delivery technique employed for signal update frequency reduction between semiconductor dies according to an embodiment of the present invention.

FIG. 8 is a timing diagram illustrating a toggle information delivery technique employed for signal update frequency reduction between semiconductor dies 702 and 704 according to an embodiment of the present invention. One signal output generated from a TX-side module X (e.g., processing module 713) toggles at time points T1 and T4. Only the toggle information Toggle of the signal output generated from the TX-side module X is transmitted. That is, when a signal toggle event (e.g., 1-to-0 signal level transition, or 0-to-1 signal level transition) occurs, the associated toggle information $Toggle_x$ is transmitted. However, when the signal level remains unchanged, no signal transmission is needed to carry the constant signal level. In this way, the bandwidth occupation of the transmission bus (e.g., InFO bus) between semiconductor dies 702 and 704 can be reduced due to that fact that only the toggle information Toggle of the signal output generated from the TX-side module X is transmitted. Besides, since the signal update frequency can be reduced, the available bandwidth of the transmission bus (e.g., InFO bus) between semiconductor dies 702 and 704 can be increased correspondingly. Further, the toggle information $Toggle_x'$ received at the RX side is decoded to restore a signal input that is transmitted to an RX-side module X' (e.g., processing module 723).

Figure 9:
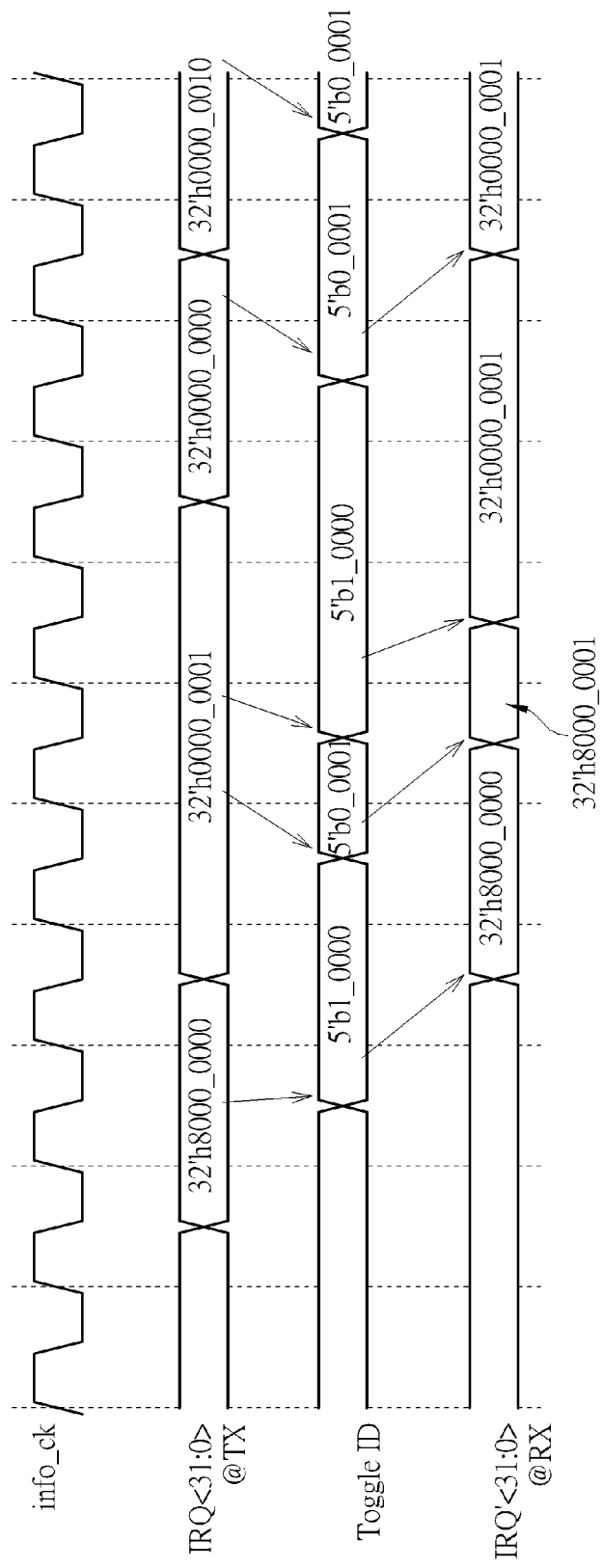
FIG. 9 is a diagram illustrating an example of delivering a 32-bit interrupt signal from one semiconductor die to another semiconductor die.

FIG. 9 is a diagram illustrating an example of delivering a 32-bit interrupt signal from one semiconductor die to another semiconductor die. The interrupt signal IRQ<31:0> generated by one semiconductor die at the TX side is a status signal that seldom toggles. The aforementioned toggle information delivery technique can be used to carry the toggle information via a transmission bus (e.g., InFO bus) between two semiconductor dies assembled in the same wafer-level package (e.g., InFO package). When the MSB (most significant bit) interrupt toggles, ToggleID=5'b1_0000. When the LSB (least significant bit) interrupt toggles, ToggleID=5'b0_0001. In addition, when the interrupt signal IRQ<31:0> has 2 bits changed, a two-phase ToggleID change is generated correspondingly as illustrated by "5'b0_0001" and "5'b1_0000". The toggle information (i.e., ToggleID) is transmitted from the semiconductor die at the TX side to another semiconductor die at the RX side. The semiconductor die at the RX side can refer to the received ToggleID to restore an interrupt signal IRQ'<31:0>.

It should be noted that the toggle information delivery technique employed by the chip design shown in FIG. 7 may be incorporated into the aforementioned chip designs shown in FIGS. 1, 3, 5 and 6. That is, a wafer-level package may be configured to employ the proposed signal count reduction technique as well as the proposed ideas of signal update frequency reduction. This also falls within the scope of the present invention.

Figure 10:
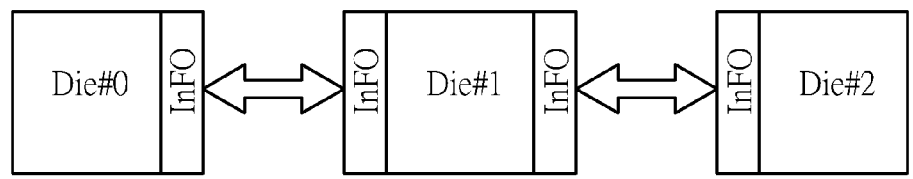
FIG. 10 is a diagram illustrating different wafer-level package designs according to an embodiment of the present invention.
Figure 10:
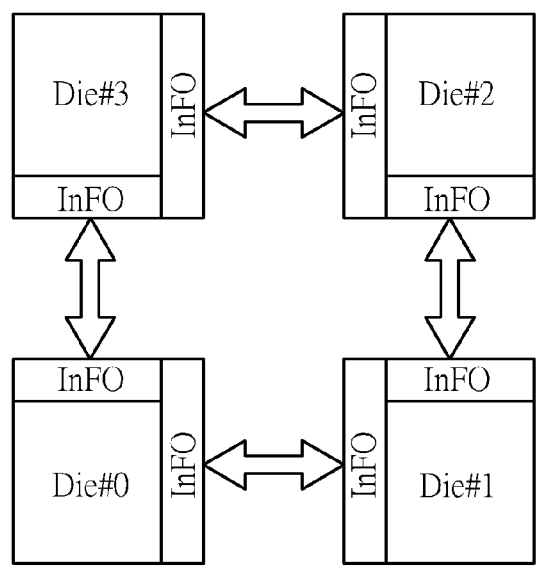

In above exemplary embodiments, the wafer-level package is shown having two semiconductor dies using proposed signal count reduction technique and/or proposed signal update frequency reduction technique. However, these are for illustrative purposes only, and are not meant to be limitations of the present invention. FIG. 10 is a diagram illustrating different wafer-level package designs according to an embodiment of the present invention. The sub-diagram (A) of FIG. 10 shows a wafer-level package (e.g., InFO package) having three semiconductor dies Die#0, Die#1, Die#2 assembled therein. The sub-diagram (B) of FIG. 10 shows a wafer-level package (e.g., InFO package) having four semiconductor dies Die#0, Die#1, Die#2, Die#3 assembled therein. When the proposed signal count reduction technique is employed by the wafer-level packages shown in FIG. 10, the reduction of die area can be achieved (e.g., required side length for configuring signals between dies can be reduced based on the fewer signal count). When the proposed signal update frequency reduction technique is employed by the wafer-level packages shown in FIG. 10, the bandwidth utilization can be improved. To put it simply, any wafer-level package with two or more semiconductor dies using proposed signal count reduction technique and/or proposed signal update frequency reduction technique falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A wafer-level package comprising:
a first semiconductor die assembled in the wafer-level package, comprising:
a first processing circuit, arranged to generate a plurality of signal outputs;
a multiplexer, arranged to multiplex the signal outputs into a multiplexed signal; and
a transmit interface, arranged to transmit the multiplexed signal to a second semiconductor die via at least one connection in the wafer-level package that is routed between the first semiconductor die and the second semiconductor die; and
the second semiconductor die assembled in the wafer-level package, comprising:
a receive interface, arranged to receive the multiplexed signal from said at least one connection;
a demultiplexer, arranged to demultiplex the multiplexed signal into a plurality of signal inputs; and
a second processing circuit, arranged to receive the signal inputs from the demultiplexer;
wherein said at least one connection routed between the first semiconductor die and the second semiconductor die is implemented on at least one metal layer to which a wafer-level process is applied.

2. The wafer-level package of claim 1, wherein the first processing circuit comprises:
   a single processing module, arranged to generate all of the signal outputs.
3. The wafer-level package of claim 1, wherein the first processing circuit comprises:
   a plurality of processing modules, arranged to generate the signal outputs, correspondingly.
4. The wafer-level package of claim 3, wherein when one of the processing modules is operated in a communication state to generate a corresponding signal output, remaining processing modules of the processing modules are operated in an execution state; and the processing modules alternately enter the communication state in a pre-defined order.
5. The wafer-level package of claim 1, wherein the wafer-level package is an integrated fan-out (InFO) package.
6. The wafer-level package of claim 1, wherein the first semiconductor die and the second semiconductor die are identical dies.
7. The wafer-level package of claim 1, wherein the second processing circuit comprises:
   a single processing module, arranged to receive all of the signal inputs.
8. The wafer-level package of claim 1, wherein the second processing circuit comprises:
   a plurality of processing modules, arranged to receive the signal inputs, correspondingly.
9. The wafer-level package of claim 8, wherein the processing modules alternately receive the signal inputs in a pre-defined order.
10. The wafer-level package of claim 1, wherein the first semiconductor and the second semiconductor die are assembled in the wafer-level package to perform a network switch function.
11. A wafer-level package comprising:
    a first semiconductor die assembled in the wafer-level package, comprising:
      a first processing circuit, comprising:
        a plurality of first processing modules, arranged to generate a plurality of signal outputs, respectively;
      an arbiter, arranged to perform arbitration upon transmission requests issued from the first processing modules and generate an arbitrated signal according to one of the signal outputs; and
      a transmit interface, arranged to transmit the arbitrated signal to a second semiconductor die via at least one connection in the wafer-level package that is routed between the first semiconductor die and the second semiconductor die; and
    the second semiconductor die assembled in the wafer-level package, comprising:
      a receive interface, arranged to receive the arbitrated signal from said at least one connection;
      a second processing circuit, comprising:
        at least one second processing module; and
        a dispatcher, arranged to dispatch the arbitrated signal to said at least one second processing module;
    wherein said at least one connection routed between the first semiconductor die and the second semiconductor die is implemented on at least one metal layer to which a wafer-level process is applied.
12. The wafer-level package of claim 11, wherein the arbiter is further arranged to generate identification information that indicates which of the first processing modules issues a transmission request granted by the arbiter; and the transmit interface is further arranged to transmit the identification information to the second semiconductor die.
13. The wafer-level package of claim 11, wherein the wafer-level package is an integrated fan-out (InFO) package.
14. The wafer-level package of claim 11, wherein the first semiconductor die and the second semiconductor die are identical dies.
15. The wafer-level package of claim 11, wherein the second processing circuit comprises a plurality of second processing modules arranged to receive a plurality of signal inputs, respectively; and the dispatcher is arranged to dispatch the arbitrated signal as a signal input to a destination processing module of the second processing modules.
16. The wafer-level package of claim 15, wherein the receive interface is further arranged to receive identification information that indicates a source of the arbitrated signal, and the dispatcher is further arranged to dispatch the arbitrated signal according to the identification information.
17. The wafer-level package of claim 11, wherein the first semiconductor and the second semiconductor die are assembled in the wafer-level package to perform a network switch function.
18. A wafer-level package comprising:
    a first semiconductor die assembled in the wafer-level package, comprising:
      a first processing circuit, arranged to generate a first signal output in a first signal waveform;
      an encoder, arranged to encode the first signal output to generate a second signal output in a second signal waveform, wherein the second signal waveform is different from the first signal waveform; and
      a transmit interface, arranged to transmit the second signal output to a second semiconductor die via at least one connection in the wafer-level package that is routed between the first semiconductor die and the second semiconductor die; and
    the second semiconductor die assembled in the wafer-level package, comprising:
      a receive interface, arranged to obtain a second signal input in the second signal waveform by receiving the second signal output from said at least one connection;
      a decoder, arranged to decode the second signal input to generate a first signal input in the first signal waveform; and
      a second processing circuit, arranged to receive the first signal input;
    wherein said at least one connection routed between the first semiconductor die and the second semiconductor die is implemented on at least one metal layer to which a wafer-level process is applied.
19. The wafer-level package of claim 18, wherein the first signal output is a less changed signal.
20. The wafer-level package of claim 18, wherein the encoder generates the second signal output according to toggle information of the first signal output.
21. The wafer-level package of claim 18, wherein the wafer-level package is an integrated fan-out (InFO) package.
22. The wafer-level package of claim 18, wherein the first semiconductor die and the second semiconductor die are identical dies.
23. The wafer-level package of claim 18, wherein the first signal input is a less changed signal.
24. The wafer-level package of claim 18, wherein the decoder generates the first signal input according to toggle information of the second signal input.

25. The wafer-level package of claim 18, wherein the first semiconductor and the second semiconductor die are assembled in the wafer-level package to perform a network switch function.

\* \* \* \* \*